United States Patent [19]

Logan

[11] Patent Number: 4,518,921
[45] Date of Patent: May 21, 1985

[54] TRACK AND HOLD CIRCUIT

[75] Inventor: Shawn M. Logan, Andover, Mass.

[73] Assignee: AT&T Bell Laboratories, Murray Hill, N.J.

[21] Appl. No.: 435,057

[22] Filed: Oct. 18, 1982

[51] Int. Cl.$^3$ ............... H03K 17/74; G11C 27/02
[52] U.S. Cl. ............................... 328/151; 307/257; 307/353
[58] Field of Search ............ 307/257, 352, 353; 328/151

[56] References Cited

U.S. PATENT DOCUMENTS

| | | | |
|---|---|---|---|
| 3,052,851 | 9/1962 | Heberling | 307/257 |
| 3,075,086 | 1/1963 | Mussard | 307/257 |
| 3,308,386 | 3/1967 | Wong | 328/151 |
| 3,389,272 | 6/1968 | Cherry | 307/257 |
| 3,480,795 | 11/1969 | Benson et al. | 307/353 |
| 3,596,191 | 7/1971 | Stuckert | 307/353 |
| 3,600,677 | 8/1971 | Uchida | 307/257 |
| 3,628,161 | 12/1971 | Earp | 328/151 |
| 3,659,117 | 4/1972 | Caveney et al. | 307/353 |
| 3,721,829 | 3/1973 | Benson | 307/352 |
| 3,851,260 | 11/1974 | Colin | 328/151 |

OTHER PUBLICATIONS

G. Erdi et al, "A Precision FET-Less Sample-and-Hold with High Charge-to-Droop Current Ratio", IEEE J. Solid-State Circuits, vol. SC13, pp. 235-243, Dec. 1978.

Primary Examiner—John Zazworsky
Attorney, Agent, or Firm—David R. Padnes

[57] ABSTRACT

A track and hold circuit comprising an electronic switch and a signal storing device. During a tracking interval, the switch couples a varying input signal from an input node to the storing device in response to at least one track control signal. In a holding interval, the switch isolates the input node in response to at least one hold control signal. An input-signal-independent and substantially constant track-to-hold offset is provided by the use of selected track and hold control signals. Specifically, the track and hold control signals respectively vary with input signal during each tracking and each holding interval and have a substantially constant difference therebetween. In the disclosed embodiments, the track and hold circuit can be easily modified to reduce the effects of feedthrough and droop.

14 Claims, 3 Drawing Figures

TRACK AND HOLD CIRCUIT

TECHNICAL FIELD

The present invention relates to a track and hold circuit and, more particularly, to a track and hold circuit which provides an input signal independent track-to-hold offset and which can be adapted to minimize the effects of feedthrough and droop.

BACKGROUND OF THE INVENTION

Track and hold circuits, also referred to as sample and hold circuits, provide samples of an analog or digital input signal and maintain the value of each sample for a predetermined time interval. Typical applications for such circuits are in analog-to-digital and digital-to-analog converters.

In general, the track and hold circuit comprises an electronic switch and a signal storing device. During each tracking interval, the switch is closed in response to a track control signal and the input signal is coupled to the signal storing device. During each holding interval, the switch is opened in response to a hold control signal, thereby isolating the signal storing device.

A problem with track and hold circuits is that each transition from track to hold deposits or removes an electronic charge from the stored signal. As a result, a track-to-hold pedestal or offset is produced which generally varies from sample to sample. In many telecommunications applications, the resulting sampling error is unacceptable.

Other problems in track and hold circuits are feedthrough and "droop" which produce variations in the signal stored during the holding interval. Feedthrough is input signal dependent and is related to the time rate of change of the input signal during the hold interval. Droop, on the other hand, is input signal independent and may be related to anomalies in the track and hold circuit components.

A variety of prior art techniques have been utilized to alleviate the problems of track-to-hold offsets, feedthrough and droop. Combining these techniques, however, is expensive to implement and/or reduces the operating speed of the track and hold circuit. Consequently, a low cost track and hold circuit that provides precise samples and is operable at high speeds would be desirable.

SUMMARY OF THE INVENTION

In accordance with the present invention, an improved track and hold circuit comprising an electronic switch and a signal storing device is provided. The track and hold functions are respectively provided by operating the switch in response to the track and hold control signals. To eliminate the problems of an input signal dependent track-to-hold offset, selected track and hold control signals are utilized. Specifically, the track and hold control signals respectively vary with the input signal during successive tracking and holding intervals and have a difference therebetween which is substantially constant. As a result, the track-to-hold offset is input-signal independent and substantially constant. Advantageously, this technique does not affect the operating speed of the track and hold circuit and can be readily adapted to minimize stored signal variations during the holding interval caused by feedthrough and/or droop.

DETAILED DESCRIPTION

Figure 1:
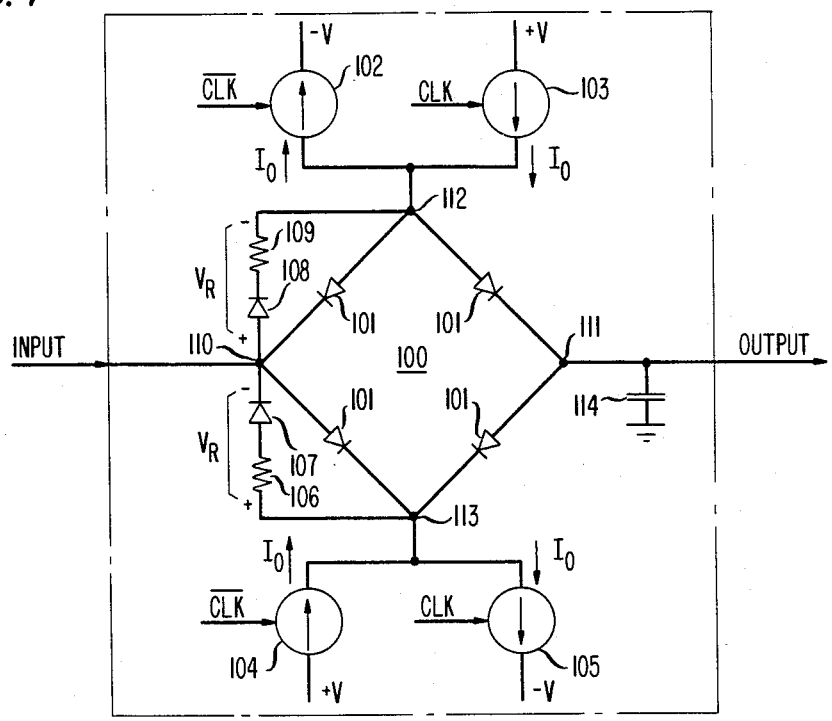
FIG. 1 is a first embodiment of the present invention.

An illustrative track and hold circuit in accordance with the present invention is shown in FIG. 1. Diode bridge 100 comprises four substantially identical and similarly poled diodes 101. Each diode 101 provides a voltage drop of $V_D$ when forward biased. To provide the track and hold functions, diode bridge 100 operates as an electronic switch in response to control signals supplied to bridge control nodes 112 and 113. During a tracking interval, track control signals are supplied which cause the varying input signal ($V_{in}$) at bridge input node 110 to be coupled to bridge output node 111. In a holding interval, hold control signals are supplied which isolate input node 110 from output node 111 and the value of $V_{in}$ at the track-to-hold transition is maintained in capacitor 114.

Current sources 103 and 105, respectively biased by reference potentials $+V$ and $-V$, generate the track control signals. Sources 103 and 105 are activated by the logical "1" level of bilevel logic signal CLK and a current $I_0$ flows from nodes 112 to 113. This current flow establishes track control signals at nodes 112 and 113 of $V_{in}+V_D$ and $V_{in}-V_D$, respectively. Hence, due to the symmetry of bridge 100, $V_{in}$ is coupled to output node 111.

The logical "0" level of CLK turns off current sources 103 and 105. While isolation of node 110 during the holding interval can be provided by supplying nodes 112 and 113 with fixed hold control signals $V_L$ and $V_H$ which back bias diodes 101, such control signals produce a varying track-to-hold offset. The varying offset is due to the fact that at each track-to-hold transition, node 112 must traverse a control signal difference of $V_L-(V_{in}+V_D)$ and node 113 must traverse a control signal difference of $V_H-(V_{in}-V_D)$. Since $V_{in}$ can have a different value at each track-to-hold transition, the time required for diodes 101 to change from the conducting to the non-conducting state varies with the value of $V_{in}$. The variation in "turn-off" time permits a varying charge to be coupled between bridge 100 and capacitor 114 at each track-to-hold transition. As a result, a varying, input-signal-dependent track-to-hold offset is produced in capacitor 114 which degrades the precision of the samples provided and is generally unpredictable.

To alleviate the varying, input-signal-dependent track-to-hold offset, current sources 103 and 105, resistors 106 and 109, and diodes 107 and 108 are utilized. During each holding interval, current sources 103 and 105 are turned off by the logical "0" level of CLK and current sources 102 and 104 are activated by the logical "1" level of bilevel logic signal $\overline{CLK}$. CLK and $\overline{CLK}$ are complementary signals and, therefore, current sources 102 and 104 are off during each tracking interval.

The activation of current sources 102 and 104 produces a current $I_0$ which flows from control node 113 through resistor 106 and diode 107 to node 110 and thence through diode 108 and resistor 109 to node 112. Diodes 107 and 108 are poled oppositely to diodes 101 to prevent current flow through resistors 106 and 109 during each tracking interval. Resistors 106 and diode 107 are selected to provide a voltage drop of $V_R$ and resistor 109 and diode 108 are similarly selected to provide a substantially identical voltage drop. $V_R$ is equal to the maximum peak-to-peak swing of $V_{in}$. The resulting hold control signals at nodes 112 and 113 are $V_{in}-V_R$ and $V_{in}+V_R$, respectively. Consequently, at each track-to-hold transition, control nodes 112 and 113 traverse a signal difference of $V_D+V_R$ which is clearly independent of $V_{in}$. The track-to-hold offset, therefore, is independent of the input signal and substantially constant in magnitude and polarity.

In the circuitry of FIG. 1, the hold control signals at nodes 112 and 113 vary with $V_{in}$ over the holding interval and output node 111 is substantially constant. As a result, any difference in the reverse bias capacitance of the two diodes connected to node 111 will cause electronic charge coupling between bridge 100 and capacitor 114. This charge coupling will cause changes in the signal stored during the holding interval. This effect is known as feedthrough and varies with the rate of change of $V_{in}$ over the holding interval.

Figure 2:
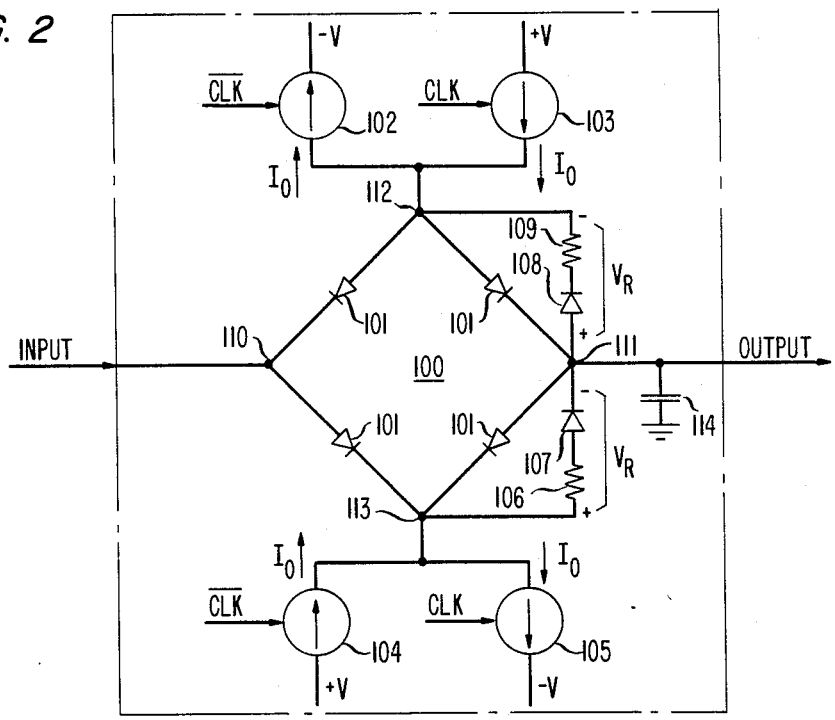
FIG. 2 is a second embodiment of the present invention.

To minimize the above-described feedthrough effects, the track and hold circuit can be modified as shown in FIG. 2. FIG. 2 is identical to FIG. 1 except that resistor 106 and diode 107 are connected between output node 111 and control node 113 and resistor 109 and diode 108 are connected between output node 111 and control node 112. Now, at each track-to-hold transition, the hold control signals are $V_{in}^*-V_R$ and $V_{in}^*+V_R$, where $V_{in}^*$ is the value of $V_{in}$ stored in capacitor 114 in each holding interval. Therefore, the hold control signals are functions of $V_{in}$ but are maintained at a constant level during the holding interval.

The embodiments of FIGS. 1 and 2 provide a substantially constant track-to-hold offset. Additionally, the embodiment of FIG. 2 reduces the effects of feedthrough. In FIG. 2, however, variations in the signal stored during each holding interval may occur if there is any mismatch in current sources 102 and 104. For example, if the current $I_0$ out of source 104 is greater than the current $I_o$ into source 102, electronic charge will be coupled to capacitor 114. Similarly, electronic charge will be removed from capacitor 114 if source 102 sinks more current than that provided by source 104. The resulting variations in the signal stored in capacitor 114 are independent of the input signal and are commonly referred to as "droop".

Figure 3:
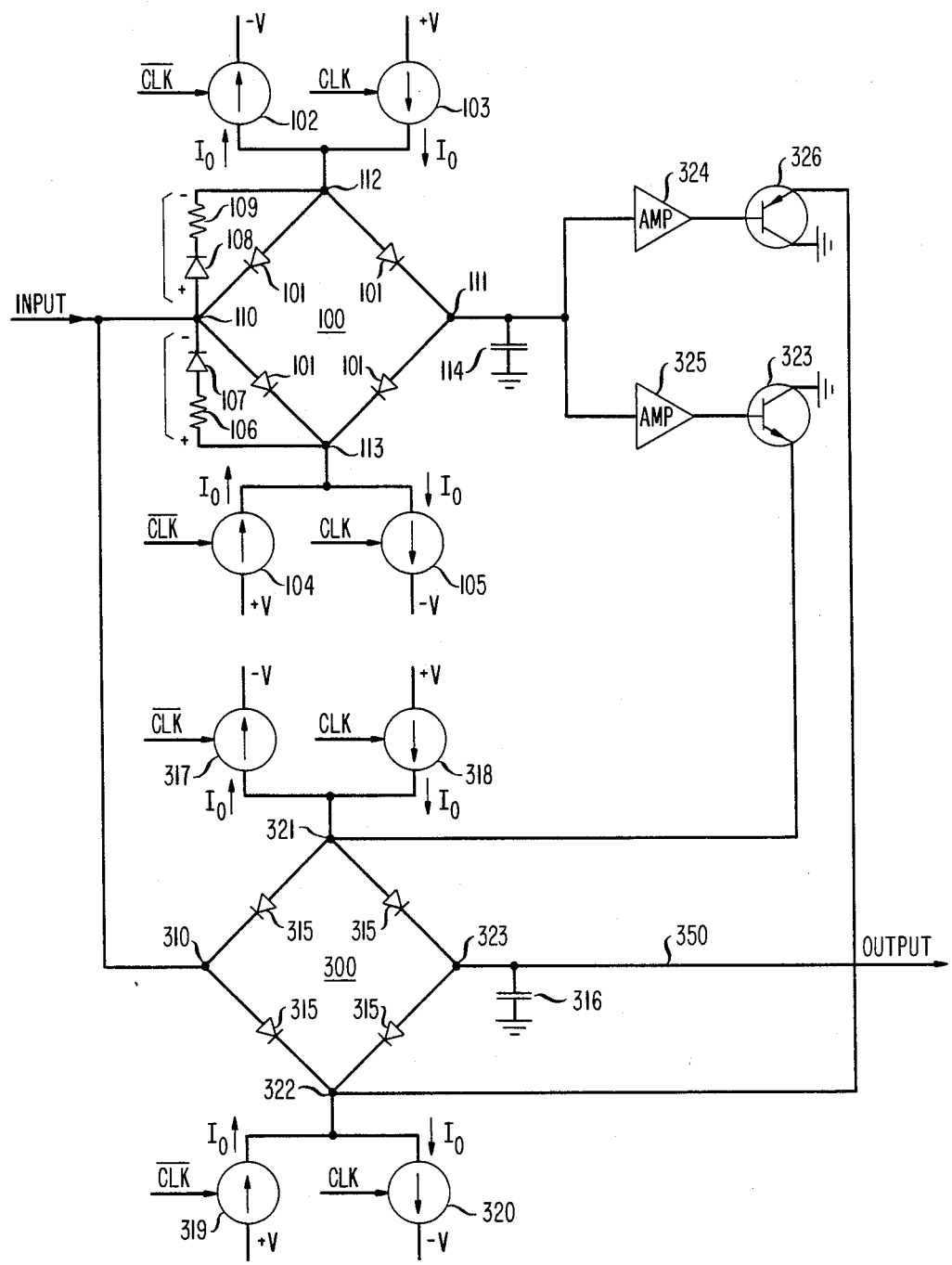
FIG. 3 is a third embodiment of the present invention.

The embodiment of FIG. 3 can be used to minimize the effects of droop discussed in reference to FIG. 2 as well as the effects of feedthrough discussed in reference to FIG. 1. In FIG. 3, a second diode bridge 300, amplifiers 324 and 325, and transistors 323 and 326 are added to the circuitry of FIG. 1. Alternatively, these components can be added to the embodiment of FIG. 2.

Bridge 300 comprises four similarly poled and substantially identical diodes 315. Input node 310 of bridge 300 is connected to input node 110 of bridge 100. Output node 323 of bridge 300 is connected to capacitor 316 through output lead 350 of the track-to-hold circuit. The operation of bridge 100 is identical to that described hereinabove and bridge 300 operates synchronously with bridge 100. In a tracking interval, current sources 318 and 320, respectively, biased by potentials +V and −V, are turned on by the logical "1" level of CLK. Consequently, as with bridge 100, track control signals are established in bridge 300 which vary with $V_{in}$. In a holding interval, current sources 318 and 320 are turned off and current sources 317 and 319, respectively biased by reference potentials −V and +V, are turned on. The control of these current sources is identical to that described in the embodiments of FIGS. 1 and 2. The activation of current sources 317 and 319 forward biases PNP transistor 326 and NPN transistor 323. Amplifier 324 and transistor 326 shift the value of $V_{in}^*$ by $+V_R$. Amplifier 325 and transistor 323 shift the value of $V_{in}^*$ by $-V_R$. Consequently, during each holding interval, the hold control signal on control node 321 is $V_{in}^*-V_R$ and the hold control signal on control node 322 is $V_{in}^*+V_R$. Accordingly, as in the embodiment of FIG. 2, feedthrough is minimized. In addition, output node 323 is isolated from current sources 102, 104, 317 and 319 in the holding interval. Therefore, any mismatch in these current sources does not affect the value stored in capacitor 316 during each holding interval. This is also the case for the addition of second diode bridge 300, amplifiers 324 and 325 and transistors 323 and 326 to the embodiment of FIG. 2.

It is to be understood that the above-described embodiments are merely illustrative of numerous other arrangements which may constitute applications of the principles of the present invention. Such other arrangements and modifications may readily be devised by those skilled in the art without departing from the spirit and scope of the invention. First, for example, while a diode bridge has been used to provide the track-to-hold switching functions, the use of the described track-to-hold control signals may be advantageously applied to other electronic switching devices. Second, while each diode bridge is controlled by two control nodes, one of the control nodes and the corresponding track and hold control signals can obviously be eliminated if $V_{in}$ is always positive or always negative. Third, while a capacitor has been used as a signal storing device, other electronic signal storing devices may be used. Finally, the duration of the tracking interval and the duration of the holding interval can be independently adjusted. Therefore, the tracking interval and the holding interval need not be of equal duration.

What is claimed is:

1. A track and hold circuit comprising
   first storing means,
   switch means for coupling a time varying input signal from an input node to said first storing means in response to at least one track control signal and isolating said input node from said first storing means in response to at least one hold control signal, and
   means for respectively supplying said track and hold control signals to said switch means during successive tracking and holding time intervals, said track signal varying with said input signal over the tracking interval and said hold control signal varying with said input signal over the holding interval.

2. The circuit of claim 1 wherein said switch means comprises a diode bridge.

3. The circuit of claim 1 wherein the tracking interval is of a first time duration and the holding interval is of a second time duration.

4. The circuit of claim 2 wherein the tracking interval is of a first time duration and the holding interval is of a second time duration.

5. The circuit of claim 1 further including
   second storing means,
   second switch means for coupling said input signal from said input node to said second storing means in response to said track control signal and isolating said input node from said second storing means in response to at least one second hold control signal, means for supplying said second hold control signal to said second switch means during the holding interval, said second hold control signal being a function of the input signal stored in said first storing means during the tracking interval.

6. The circuit of claim 5 wherein second hold control signal is substantially constant over the holding interval.

7. The circuit of claim 5 wherein said switch means and second switch means each comprises a diode bridge.

8. The circuit of claim 5 wherein the tracking interval is of a first time duration and the holding interval is of a second time duration.

9. The circuit of claim 6 wherein the tracking interval is of a first time duration and the holding interval is of a second time duration.

10. The circuit of claim 7 wherein the tracking interval is of a first time duration and the holding interval is of a second time duration.

11. A track and hold circuit comprising
first storing means,
switch means for coupling a time varying input signal from an input node to said first storing means in response to at least one track control signal and isolating said input node from said first storing means in response to at least one hold control signal,
second storing means,
second switch means for coupling said input signal from said input node to said second storing means in response to said track control signal and isolating said input node from said second storing means in response to said hold control signal, and
means for respectively supplying said track and hold control signals to said switch means and second switch means during successive tracking and holding time intervals, said track control signal varying with said input signal over the tracking interval and said hold control signal being a function of said input signal at the onset of the holding interval, said track and hold control signals having a difference therebetween which is independent of said input signal.

12. The circuit of claim 11 wherein said hold control signal varies with said input signal over the holding interval.

13. The circuit of claim 12 wherein the tracking interval is of a first time duration and the holding interval is of a second time duration.

14. A track and hold circuit comprising
a diode bridge comprising a first pair of diodes having their anodes connected together at a first control node, a second pair of diodes having their cathodes connected together at a second control node, an input node connected to the cathode and anode of a selected diode in each of said first and second pairs and an output node connected to the cathode and anode of another diode in each of said first and second pairs,
storing means connected to said output node,
a serially connected resistor and first diode disposed between said first control node and said output node with the anode of said first diode connected to said output node, and
a serially connected second resistor and second diode disposed between said output node and said second control node with the cathode of said second diode connected to said output node.

* * * * *